United States Patent [19]

Edmond et al.

[11] Patent Number: 5,838,706
[45] Date of Patent: Nov. 17, 1998

[54] LOW-STRAIN LASER STRUCTURES WITH GROUP III NITRIDE ACTIVE LAYERS

[75] Inventors: John Adam Edmond; Gary E. Bulman, both of Cary; Hua-Shuang Kong, Raleigh, all of N.C.

[73] Assignee: Cree Research, Inc., Durham, N.C.

[21] Appl. No.: 752,203

[22] Filed: Nov. 19, 1996

Related U.S. Application Data

[62] Division of Ser. No. 309,247, Sep. 20, 1994, Pat. No. 5,592,501.

[51] Int. Cl.$^6$ ........................................................ H01S 3/19
[52] U.S. Cl. ................................................................ 372/45
[58] Field of Search ................................ 257/77; 372/44, 372/45, 46

[56] References Cited

U.S. PATENT DOCUMENTS

| | | | |
|---|---|---|---|
| 5,247,533 | 9/1993 | Okazaki et al. | 372/45 |
| 5,273,933 | 12/1993 | Hatano et al. | 437/127 |
| 5,290,393 | 3/1994 | Nakamura | 156/614 |
| 5,306,662 | 4/1994 | Nakamura et al. | 437/107 |
| 5,387,804 | 2/1995 | Suzuki et al. | 257/77 |
| 5,432,808 | 7/1995 | Hatano et al. | 372/45 |

FOREIGN PATENT DOCUMENTS

0541373 A2  5/1993  European Pat. Off. .

OTHER PUBLICATIONS

V.A. Dmitriev, *SiC–Based Solid Solutions: Technology and Properties*, Springer Proceedings in Physics, vol. 56, 1992, pp. 3–14. (No month).

J.N. Kuznia et al., *Influence of Buffer Layers on the Deposition of High Quality Single Crystal GaN over Sapphire Substrates*, J. Appl. Phys., vol. 73, No. 9, May 1993, pp. 4700–4702.

M. Asif Khan et al., *The Nature of Donor Conduction in n–GaN*, J. Appl. Phys., vol. 74, No. 9, Nov. 1993, pp. 5901–5903.

Isamu Akasaki et al., *Effects of AlN Buffer Layer on Crystallographic Structure and on Electrical and Optical Properties of GaN and $Ga_{1-x}Al_xN$ ($0<x\leq0.4$) Films Grown on Sapphire Substrate by MOVPE*, Journal of Crystal Growth, vol. 98, 1989, pp. 209–219. (No month).

Shuji Nakamura, *GaN Growth Using GaN Buffer Layer*, Japanese Journal of Applied Physics, vol. 30, No. 10A, Oct. 1991, pp. L1705–L1707.

Shuji Nakamura et al., *Candela–Class High–Brightness InGaN/AlGaN Double–Heterostructure Blue–Light–Emitting Diodes*, Appl. Phys. Lett., vol. 64, No. 13, Mar. 1994, pp. 1687–1689.

Shuji Nakamura, *InGaN/AlGaN Double–Heterostructure Blue LEDs* (undated).

*Primary Examiner*—James W. Davie
*Attorney, Agent, or Firm*—Philip Summa

[57] ABSTRACT

A Group III nitride laser structure is disclosed with an active layer that includes at least one layer of a Group III nitride or an alloy of silicon carbide with a Group III nitride, a silicon carbide substrate, and a buffer layer between the active layer and the silicon carbide substrate. The buffer layer is selected from the group consisting of gallium nitride, aluminum nitride, indium nitride, ternary Group III nitrides having the formula $A_xB_{1-x}N$, where A and B are Group III elements and where x is zero, one, or a fraction between zero and one, and alloys of silicon carbide with such ternary Group III nitrides. In preferred embodiments, the laser structure includes a strain-minimizing contact layer above the active layer that has a lattice constant substantially the same as the buffer layer.

4 Claims, 4 Drawing Sheets

LOW-STRAIN LASER STRUCTURES WITH GROUP III NITRIDE ACTIVE LAYERS

This application is a divisional of application Ser. No. 08/309,247, filed Sep. 20, 1994, U.S. Pat. No. 5,592,501.

BACKGROUND OF THE INVENTION

The invention relates to semiconductor laser structures, and in particular relates to laser structures formed from Group III nitrides (i.e., Group III of the Periodic Table of the Elements) that will produce output in the blue to ultraviolet portions of the electromagnetic spectrum.

FIELD OF THE INVENTION

A laser is a device that produces a beam of coherent or monochromatic light as a result of stimulated emission. Light beams produced by lasers can have extremely high energy because of their single wavelength, frequency, and coherence. A number of materials are capable of producing the lasing effect and include certain high-purity crystals (ruby is a common example), semiconductors, certain types of glass, certain gases including carbon dioxide, helium, argon and neon, and certain plasmas.

High power lasers are useful in industry for cutting difficult materials such as metals, composites and diamonds. Lasers are also used to promote chemical reactions (e.g., flash photolysis) as well as for spectroscopy and photography. Laser techniques are also applied in medicine and surgery. High-powered lasers are used for controlled fusion reactions while others are used for biomedical investigations, for organic chemical research, for other sophisticated analytical techniques, and in three-dimensional photography (holography).

More recently, lasers have been developed in semiconducting materials, thus taking advantage of the smaller size, lower cost and other related advantages typically associated with semiconductor devices. In the semiconductor arts, devices in which photons play a major role are referred to as "photonic" or "optoelectronic" devices. In turn, photonic devices include light-emitting diodes (LEDs), photodetectors, photovoltaic devices, and semiconductor lasers.

Semiconductor lasers are similar to other lasers in that the emitted radiation has spacial and temporal coherence. As noted above, laser radiation is highly monochromatic (i.e., of narrow band width) and it produces highly directional beams of light. Semiconductor lasers differ, however, from other lasers in several respects. For example, in semiconductor lasers, the quantum transitions are associated with the band properties of materials; semiconductor lasers are very compact in size, have very narrow active regions, and larger divergence of the laser beam; the characteristics of a semiconductor laser are strongly influenced by the properties of the junction medium; and for p-n junction lasers, the lasing action is produced by passing a forward current through the diode itself. Overall, semiconductor lasers provide very efficient systems that are easily modulated by modulating the current directed across the devices. Additionally, because semiconductor lasers have very short photon lifetimes, they could be used to produce high-frequency modulation. In turn, the compact size and capability for such high-frequency modulation make semiconductor lasers an important light source for optical fiber communications.

In broad terms, the structure of a semiconductor laser should meet three broad requirements: optical confinement, electrical confinement, and mirroring. Additionally, in order to produce the laser effect (stimulated emission of radiation), the semiconductor must be a direct bandgap material rather than an indirect bandgap material. As known to those familiar with semiconductor characteristics, a direct bandgap material is one in which an electron's transition from the valence band to the conduction band does not require a change in crystal momentum for the electron. Gallium arsenide and gallium nitride are examples of direct semiconductors. In indirect semiconductors, the alternative situation exists; i.e., a change of crystal momentum is required for an electron's transition between the valence and conduction bands. Silicon and silicon carbide are examples of such indirect semiconductors.

A useful explanation of the theory, structure and operation of semiconductor lasers, including optical and electronic confinement and mirroring, is given by *Sze, Physics of Semiconductor Devices,* 2nd Edition (1981) at pages 704–742, and these pages are incorporated entirely herein by reference.

As known to those familiar with photonic devices such as LEDs and lasers, the frequency of electromagnetic radiation (i.e., the photons) that can be produced by a given semiconductor material are a function of the material's bandgap. Smaller bandgaps produce lower energy, longer wavelength photons, while wider bandgap materials are required to produce higher energy, shorter wavelength photons. For example, one semiconductor commonly used for lasers is indium gallium aluminum phosphide (InGaAlP). Because of this material's bandgap (actually a range of bandgaps depending upon the mole or atomic fraction of each element present), the light that InGaAlP can produce is limited to the red portion of the visible spectrum, i.e., about 600 to 700 nanometers (nm).

Working backwards, in order to produce photons that have wavelengths in the blue or ultraviolet portions of the spectrum, semiconductor materials are required that have relatively large bandgaps. Typical candidate materials include silicon carbide (SiC) and gallium nitride (GaN).

Shorter wavelength lasers offer a number of advantages in addition to color. In particular, when used in optical storage and memory devices (e.g., "CD-ROM" or "optical disks"), their shorter wavelengths enable such storage devices to hold proportionally more information. For example, an optical device storing information using blue light can hold approximately 32 times as much information as one using red light, in the same space.

Silicon carbide has been demonstrated to produce excellent light-emitting diodes (LEDs) in the blue and ultraviolet (UV) range of the spectrum (and correspondingly photodetectors as well), but is an indirect bandgap material, and thus although useful for LEDs, will not produce the laser effect.

Gallium nitride, however, is an attractive laser candidate material for blue and UV frequencies because of its relatively high bandgap (3.36 eV at room temperature). Gallium nitride suffers from a different disadvantage, however: the failure to date of any workable technique for producing bulk single crystals of gallium nitride which could form appropriate substrates for gallium nitride photonic devices. As is known to those familiar with semiconductor devices, they all require some sort of structural substrate, and typically a substrate formed of the same materials as the active region of a device offers significant advantages, particularly in crystal growth and matching. Because gallium nitride has yet to be formed in such bulk crystals, however, gallium nitride photonic devices must be formed in epitaxial layers on different substrates.

Using different substrates, however, causes an additional set of problems, mostly in the area of crystal lattice matching. In almost all cases, different materials have different crystal lattice parameters. As a result, when a gallium nitride epitaxial layer is grown on a different substrate, some crystal mismatch will occur, and the resulting epitaxial layer is referred to as being "strained" by this mismatch. Such mismatches, and the strain they produce, carry with them the potential for crystal defects which in turn affect the electronic characteristics of the crystals and the junctions, and thus correspondingly tend to degrade or even prevent the performance of the photonic device. Such defects are even more problematic in laser structures because semiconductor lasers typically operate at electrical power levels at least an order of magnitude greater than those at which LEDs operate.

To date, the most common substrate for gallium nitride devices—and the only substrate utilized in GaN LED's—has been sapphire; i.e., aluminum oxide ($Al_2O_3$). Sapphire is optically transparent in the visible and UV ranges, but is unfortunately insulating rather than conductive, and carries a lattice mismatch with gallium nitride of about 16%. In the absence of a conductive substrate, "vertical" devices (those with contacts on opposite sides) cannot be formed, thus complicating the manufacture and use of the devices.

As a particular disadvantage, horizontal structures (those with contacts on the same side of the device), such as those required when gallium nitride is formed on sapphire, also produce a horizontal flow of current density. This horizontal current flow puts an additional strain on the already-strained (i.e., the 16% lattice mismatch) GaN-sapphire structure.

Gallium nitride also carries a lattice mismatch of about 2.4% with aluminum nitride (AlN) and a 3.5% mismatch with silicon carbide. Silicon Carbide has a somewhat lesser mismatch (only about 1%) with aluminum nitride.

Group III ternary and quaternary nitrides (e.g., InGaN, InGaAlN, etc.) have also been shown to have relatively wide bandgaps and thus also offer the potential for blue and ultraviolet semiconductor lasers. Most of these compounds, however, present the same difficulty as gallium nitride: the lack of an identical single crystal substrate. Thus, each must be used in the form of epitaxial layers grown on different substrates. Thus, they present the same potential for crystals defects and their associated electronic problems.

OBJECT AND SUMMARY OF THE INVENTION

Therefore, it is an object of the present invention to provide Group III nitride laser structures that meet all of the requirements for laser capability and that can be formed on conductive substrates of silicon carbide.

The invention meets this object with a separate-confinement heterostructure laser that includes an indium gallium nitride active layer, upper and lower waveguide layers on the active layer and formed of aluminum gallium nitride or indium gallium nitride, upper and lower cladding layers on the respective upper and lower waveguide layers formed of aluminum gallium nitride, and a strain-minimizing aluminum gallium nitride contact layer on the upper cladding layer.

In another aspect, the invention comprises a substrate structure that will support such a Group III nitride laser structure with minimum strain. In this aspect, the invention comprises a silicon carbide substrate, a first buffer layer upon the substrate formed of a graded composition of silicon carbide aluminum gallium nitride (($SiC)_x(Al_yGa_{1-y}N)_{1-x}$; where $0 \leq x, y \leq 1$)), and a second buffer layer upon the first layer and formed of a graded composition of aluminum and gallium nitride ($Al_yGa_{1-y}N$).

In yet another embodiment, the invention comprises a Group III nitride laser structure that has an active layer that includes at least one layer of a Group III nitride, a silicon carbide substrate, and a coupling structure between the active layer and the substrate.

In a further aspect the invention comprises a Group III nitride laser structure with an active layer that includes at least one layer of a Group III nitride, a silicon carbide substrate, and a buffer layer between the active layer and the silicon carbide substrate. The buffer layer is selected from the group consisting of gallium nitride, aluminum nitride, indium nitride, and ternary Group III nitrides having the formula $A_xB_{1-x}N$, where A and B are Group III elements and where x is zero, one, or a fraction between zero and one. The structure can further include a strain-minimizing contact layer above the active layer that has a lattice constant substantially the same as the buffer layer.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION

Figure 1:
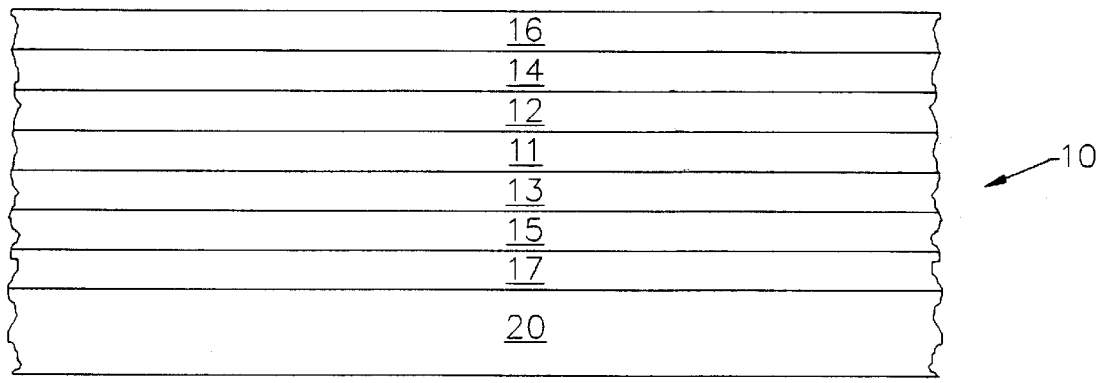
FIG. 1 is a cross-sectional representation of a separate confinement heterostructure laser according to the present invention.

The present invention is a laser diode structure which is grown on a lattice mismatched silicon carbide substrate. As used herein, the term "lattice mismatched" means that one or more layers of the laser structure have crystal lattice parameters different from the crystal lattice parameters of silicon carbide. The structure of the invention balances the individual strains of each layer to produce a structure with minimal net strain. FIG. 1 illustrates one embodiment of a separate-confinement heterostructure (SCH) indium gallium nitride laser broadly designated at 10 according to the present invention. The laser structure 10 includes an indium gallium nitride active layer 11. Upper and lower waveguide layers 12 and 13 respectively bracket the active layer and provide part of the waveguiding required for a laser of this type. The waveguide layers 12 and 13 are preferably formed of aluminum gallium nitride. Upper and lower cladding layers 14 and 15 respectively are on the respective upper and lower waveguide layers 12 and 13 and are also formed of aluminum gallium nitride, thus completing the optical waveguide structure.

In preferred embodiments, a strain minimizing layer 16 which is formed of aluminum gallium nitride and also serves as a top contact layer is on the upper cladding layer 14. The structure also includes a buffer layer 17 and an appropriate substrate 20, preferably formed of silicon carbide. Optionally a very thin layer of gallium nitride (not shown) can be added to the strain minimizing layer 16 and can serve as the top contact layer for the overall structure.

As known to those familiar with semiconductor laser structures, in order to enhance the laser capabilities of the device, particularly a separate confinement heterostructure such as the present invention, the active layer should desirably have a lower bandgap than the adjacent waveguide and cladding layers, and a higher refractive index than the adjacent waveguide and cladding layers. Such a structure gives two benefits important for laser capability. First, if the active layer has the lowest bandgap, it forms a quantum well into which electrons tend to fall, thus helping enhance the laser effect. Second, waveguiding occurs in the material that has the highest refractive index in the structure. Accordingly, when the bandgap of the active layer is less than that of the adjacent layers, and its refractive index is greater than that of the adjacent layers, the lasing capabilities of the device are enhanced.

Accordingly, in FIG. 1, the indium gallium nitride layer 11 preferably has the composition $In_zGa_{1-z}N$, where z is a fraction between 0 and 1. As known to those familiar with Group III elements (e.g., Sze p. 706), when compound semiconductors are formed that have more than one Group III element, these compounds are present as crystalline solid solutions. The formulations are often given in alphabetical order (Al, Ga, In), or in order of atomic number (aluminum 13, gallium 31, indium 49). In broad terms, the Group III nitride compounds described herein for the active, waveguide, cladding, and buffer layers can include the following: gallium nitride; aluminum nitride; indium nitride; ternary Group III nitrides having the formula $A_xB_{1-x}N$, where A and B are Group III elements and where x is zero, one, or a fraction between zero and one; quaternary Group III nitrides having the formula $A_xB_yC_{1-x-y}N$, where A, B and C are Group III elements and where x and y are zero, one, or a fraction between zero and one and 1 is greater than (x+y); and alloys of silicon carbide with such ternary and quaternary Group III nitrides.

In such Group III compounds, the bandgap of the compound semiconductor tends to increase as the proportion of aluminum increases and the index of refraction increases as the proportion of aluminum decreases. Accordingly, in a preferred embodiment, the waveguide layers 12 and 13 have the formula $Al_xGa_{1-x}N$, where x is 0, 1, or a fraction between 0 and 1. As Table IIb indicates, however, in some embodiments the waveguide layers can contain indium as well. Because the waveguide layers have more aluminum (i.e., a greater atomic or mole fraction) than the active layer, they have a larger bandgap, thus encouraging electrons to move into the active layer in the desired manner. Expressed differently, the waveguide layers 12 and 13 have bandgaps larger than the active layer 11.

For the reasons just stated with respect to refractive index, the waveguide layers preferably have refractive indexes that are smaller than the active layer so that they encourage wave propagation to occur in the active layer as is most desirable for a laser structure.

In turn, the cladding layers 14 and 15 have the formula $Al_yGa_{1-y}N$ wherein y is greater than x and where y is 0, 1, or a fraction between 0 and 1. In other words, the cladding layers have a greater atomic fraction of aluminum in the compound semiconductor than do the waveguide layers 12 and 13, and thus have a higher bandgap and a smaller refractive index than the waveguide layers.

Finally, the strain minimizing contact layer 16 has the formula $Al_wGa_{1-w}N$ wherein w is greater than x and less than y and where w is 1, 0, or a fraction between 1 and 0.

In preferred embodiments, the laser structure of FIG. 1 is constructed so that the upper waveguide and upper cladding layers 12 and 14 have the same conductivity type as each other, and the lower waveguide and lower cladding layers 13 and 15 have the same conductivity type and that is opposite to the conductivity type of the upper layers. This permits, of course, current injection through the device between the opposite conductivity type portions. In the most preferred structures, the upper layers 12 and 14 are p-type, the lower layers 13 and 15 are n-type, and the strain minimizing top contact layer 16 is p-type.

In addition to the optical and electronic characteristics of the preferred structure, the embodiment illustrated in FIG. 1 also minimizes the strain between layers of different materials that have different crystal lattices. In the invention, each of the waveguide and cladding layers has a thickness sufficient to accommodate the strain between it and its adjacent layers, but less than the thickness at which misfit dislocations begin to form. In this regard, it will be understood by those familiar with semiconductor crystal structures that strain effects are present any time two different materials are adjacent to one another. As a result, the preferred thickness for an epitaxial layer is a thickness that is appropriate for the other performance parameters of the device, but less than the critical thickness. The critical thickness is the maximum thickness that the layer can be grown in strained fashion before dislocations begin to propagate. The strain ("$\epsilon$") between two layers is often expressed as the difference in the crystal lattice parameters between the two layers ($\Delta a$) divided by the lattice parameter of one of the layers (a), often the substrate. The higher this strain value, the thinner the layer that can be grown between the two materials. Furthermore, in a multilayer structure such as illustrated in FIG. 1, the overall strain ("$\Sigma$") is a function or summation of the individual layer strains, and is referred to as the "effective strain."

Accordingly, a preferred embodiment of the laser structure of FIG. 1 includes the silicon carbide substrate 20 and the buffer layer 17 which is formed of one or more layers having a composition selected from the group consisting of gallium nitride, aluminum nitride, and $Al_xGa_{1-x}N$ ($0 \leq x \leq 1$). Such a buffer is described in copending application Ser. No. 08/166,229 filed Dec. 13, 1993, and now U.S. Pat. No. 5,393,993, which is commonly assigned with the pending application, and which is incorporated entirely herein by reference.

Additionally, in a preferred embodiment, the strain minimizing contact layer 16 has a lattice constant that matches as closely as possible the lattice constant of the buffer layer 17. Although these two layers are not in contact with one another, matching their lattice constants nevertheless reduces strain. Strain is minimized when the lattice constant of the buffer layer is substantially the same as the average of the layers above the buffer layer. By adding the strain-reducing layer 16 with essentially the same lattice constant as the buffer layer 17, the average lattice constant of the layers above the buffer moves more closely toward the buffer and thus reduces the overall strain of the entire structure. Stated differently, the presence of the top layer 16 moves the weighted average of all of the layers 11, 12, 13, 14, 15 and 16 closer to the lattice constant of the buffer layer 17 and thus reduces the overall strain.

Accordingly, in preferred embodiments, the lattice constant of the buffer layer 17 is substantially the average of the lattice constants of the active layer 11, the waveguide layers 12 and 13, the cladding layers 14 and 15, and the strain minimizing contact layer 16.

Exemplary compositions of a laser structure similar to that illustrated at 10 in FIG. 1 are set forth in the following tables in which $\lambda$ represents the laser's emission wavelength and d/Γ represents the ratio of the active layer thickness to the confinement factor. In laser diodes, d/Γ is proportional to the threshold current density, and a low value is desired. The layer thicknesses are expressed in angstroms ($10^{-10}$ meter).

TABLE I

Strain-optimized strained-layer laser structure for 10% In active region ($\lambda_g$ = 400 nm, d/Γ = 0.221).

| Layer | Composition | Thickness |
| --- | --- | --- |
| Top/Contact Layer | $Al_{0.10}Ga_{0.90}N$ | 10000 A |
| Upper Cladding | $Al_{0.12}Ga_{0.88}N$ | 4000 |
| Upper Waveguide | $Al_{0.01}Ga_{0.99}N$ | 700 |
| Active Region | $In_{0.10}Ga_{0.90}N$ | 100 |
| Lower Waveguide | $Al_{0.01}Ga_{0.99}N$ | 700 |
| Lower Cladding | $Al_{0.12}Ga_{0.88}N$ | 4000 |
| Buffer Layer | $Al_{0.10}Ga_{0.90}N$ | — |

TABLE IIa

Strain-optimized strained-layer laser structure for 15% In active region ($\lambda_g$ = 415 nm, d/Γ = 0.286).

| Layer | Composition | Thickness |
| --- | --- | --- |
| Top/Contact Layer | $Al_{0.15}Ga_{0.85}N$ | 10000 A |
| Upper Cladding | $Al_{0.17}Ga_{0.83}N$ | 4000 |
| Upper Waveguide | $Al_{0.04}Ga_{0.96}N$ | 500 |
| Active Region | $In_{0.15}Ga_{0.85}N$ | 60 |
| Lower Waveguide | $Al_{0.04}Ga_{0.96}N$ | 500 |
| Lower Cladding | $Al_{0.17}Ga_{0.83}N$ | 4000 |
| Buffer Layer | $Al_{0.15}Ga_{0.85}N$ | — |

TABLE IIb

Strained-optimized strained-layer laser structure for 15% In active region ($\lambda_g$ = 415 nm, d/Γ = 0.303).

| Layer | Composition | Thickness |
| --- | --- | --- |
| Top/Contact Layer | GaN | 5000 A |
| Upper Cladding | $Al_{0.02}Ga_{0.98}N$ | 4000 |
| Upper Waveguide | $In_{0.02}Ga_{0.98}N$ | 1000 |
| Active Region | $In_{0.15}Ga_{0.85}N$ | 90 |
| Lower Waveguide | $In_{0.02}Ga_{0.98}N$ | 1000 |
| Lower Cladding | $Al_{0.02}Ga_{0.98}N$ | 4000 |
| Buffer Layer | GaN | — |

TABLE III

Strain-optimized strained-layer laser structure for 20% In active region ($\lambda_g$ = 430 nm, d/Γ = 0.322).

| Layer | Composition | Thickness |
| --- | --- | --- |
| Top/Contact Layer | $Al_{0.10}Ga_{0.90}N$ | 5000 A |
| Upper Cladding | $Al_{0.12}Ga_{0.88}N$ | 4000 |
| Upper Waveguide | $Al_{0.01}Ga_{0.99}N$ | 600 |
| Active Region | $In_{0.20}Ga_{0.80}N$ | 50 |
| Lower Waveguide | $Al_{0.01}Ga_{0.99}N$ | 600 |
| Lower Cladding | $Al_{0.12}Ga_{0.88}N$ | 4000 |
| Buffer Layer | $Al_{0.10}Ga_{0.90}N$ | — |

For all the reasons just discussed, and in addition to producing a minimized strained laser structure, it will be clearly understood that the substrate structure—i.e. the bulk single crystal substrate and any buffer layers upon it—likewise should be optimized to obtain successful laser structures of the type described herein. Thus, in a second aspect of the invention, and as illustrated at 22 in FIG. 2, an appropriate substrate structure includes a silicon carbide substrate 23 and first and second buffer layers 24 and 25 upon the substrate. The first buffer layer 24 is formed of a graded composition of silicon carbide and aluminum gallium nitride $((SiC)_x(Al_yGa_{1-y}N)_{1-x})$ in which the portion adjacent the substrate is substantially entirely silicon carbide and the portion furthest from the substrate is substantially entirely aluminum gallium nitride ($Al_yGa_{1-y}N$) with the portions therebetween being progressively graded in content from predominantly silicon carbide to predominantly $Al_yGa_{1-y}N$. The grading is in terms of atomic fraction and is possible because of the good alloying properties of silicon carbide with Group III nitrides. Using appropriate epitaxial growth techniques, the grading can be controlled to produce the layers described.

The second buffer layer 25 on the first layer 24 is formed of a similarly graded composition, but one of graded aluminum gallium nitride, i.e., from $Al_yGa_{1-y}N$ to $Al_zGa_{1-z}N$, where "z" can differ from "y." In the second buffer layer 25, the portion adjacent the first layer 24 is a first composition of $Al_yGa_{1-y}N$ and the portion furthest from the first layer is a second composition of $Al_zGa_{1-z}N$ with the portions therebetween being progressively graded in content from one aluminum gallium nitride composition to the other. As set forth earlier, these various compositions of Group III nitrides exist in crystalline form as solid solutions and thus the second buffer layer 25 can be appropriately and uniformly graded in the same manner as buffer layer 24.

Figure 2:
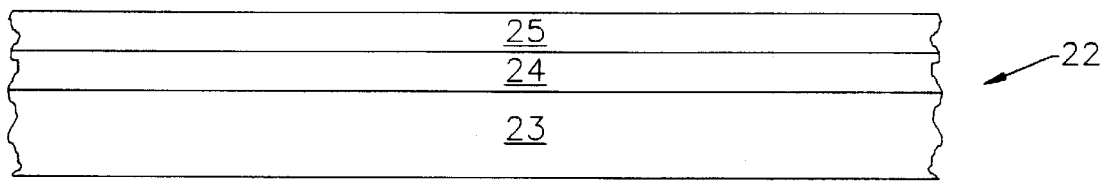
FIG. 2 is a cross-sectional representation of a substrate structure that will support a Group III nitride laser structure according to the present invention.

In FIG. 2, the second buffer layer 25 of aluminum gallium nitride can have one of the desired compositions set forth in Table 1. In a most preferred embodiment, the $Al_zGa_{1-z}N$ composition portion of the graded second layer 25 matches the aluminum gallium nitride composition of the lower cladding layer of a laser structure built upon the substrate structure 22. Such a composition can, of course, include compositions matching those set forth in Tables I, IIa, IIb, and III for the lower cladding layer 15.

Figure 3:
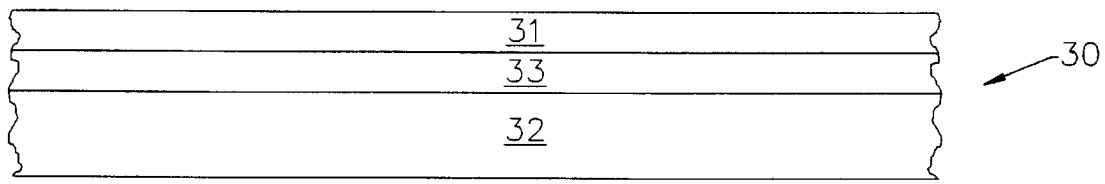
FIG. 3 is a cross-sectional representation of a Group III nitride laser structure according to the present invention.

FIG. 3 shows a third embodiment broadly designated at 30 in which an entire laser structure is schematically illustrated. The structure includes an active layer 31 that has at least one layer of a Group III nitride, a silicon carbide substrate 32, and a coupling structure 33 between the active layer 31 and the substrate 32, the coupling layer including at least one graded layer of silicon carbide and a Group III nitride in which the graded layer is silicon carbide at the interface with the substrate 32, and the graded layer is the Group III nitride at the interface with the active layer 31.

The remaining figures demonstrate further advantages and beneficial characteristics of the present invention.

Figure 4:
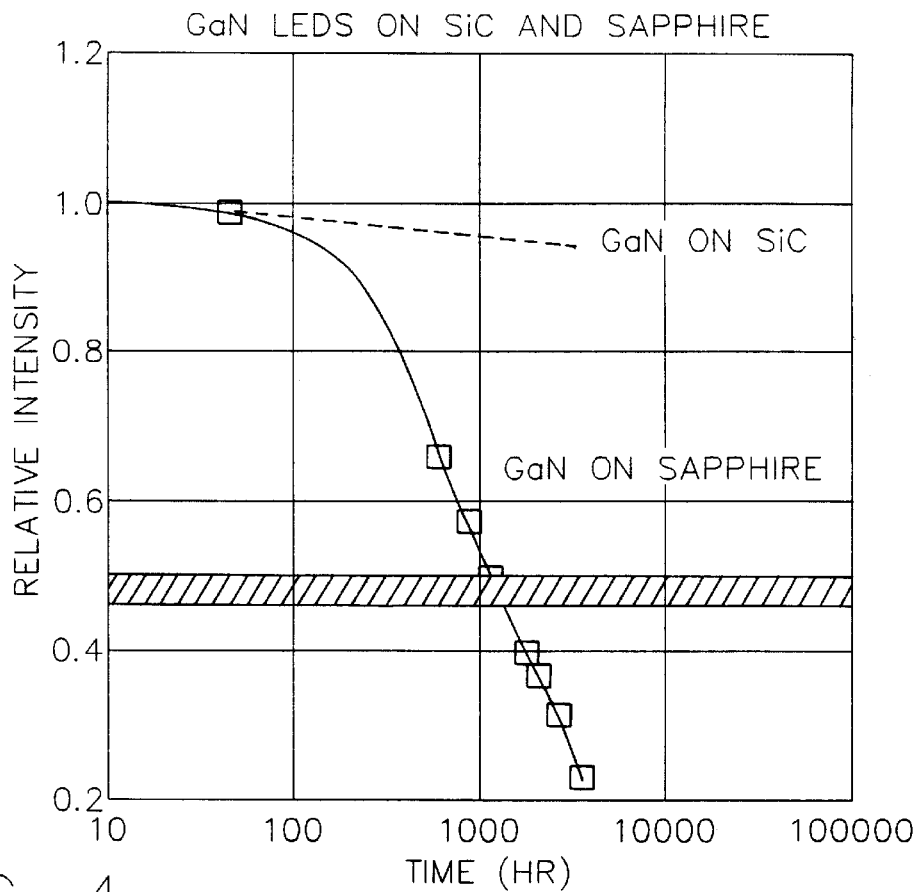
FIG. 4 is a plot of relative intensity versus hours of operation (i.e., degradation curve) for GaN LEDs on sapphire and the expected degradation for GaN LEDs on silicon carbide according to the present invention.

FIG. 4 is a plotted curve showing the known degradation of gallium nitride LEDs on sapphire and the expected degradation of gallium nitride LEDs on silicon carbide, with the prediction being based upon the known characteristics of silicon carbide and silicon carbide devices, and their demonstrated performances to date.

Figure 5:
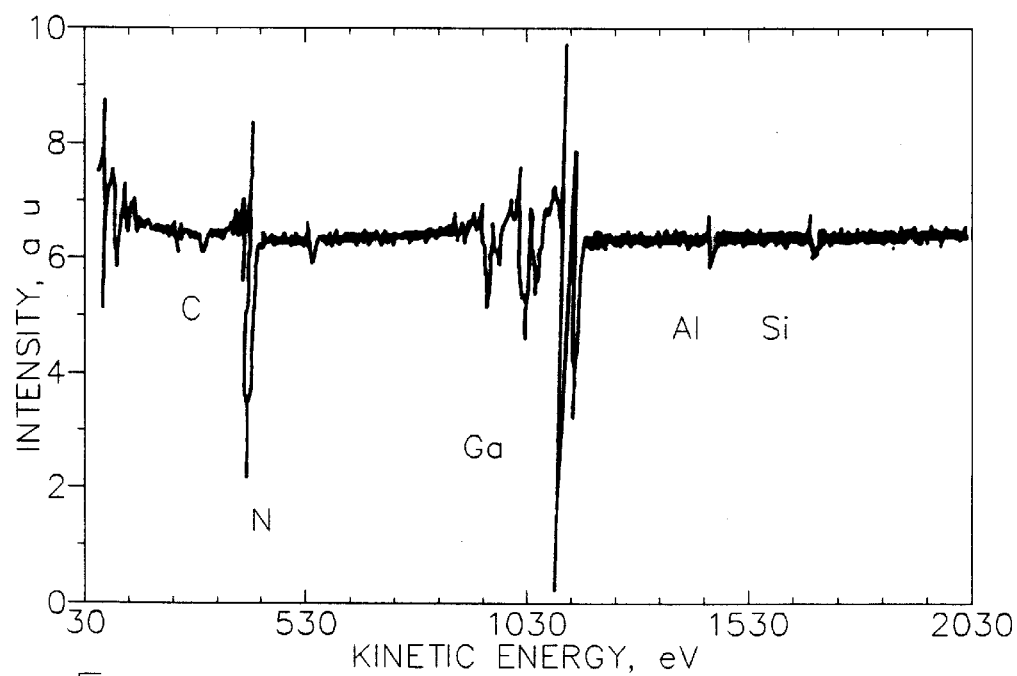
FIG. 5 is an auger electron spectrum (AES) for a typical $(SiC)_x(Al_yGa_{1-y})_{1-x}$ layer according to the present invention.

FIG. 5 is an auger electron spectrum of a silicon carbide aluminum gallium nitride layer according to the present invention demonstrating that all five elements (Si, C, Al, Ga, N) were present in the layer examined. High energy electron diffraction of layers having this auger electron spectrum showed that they were single crystal layers.

Figure 6:
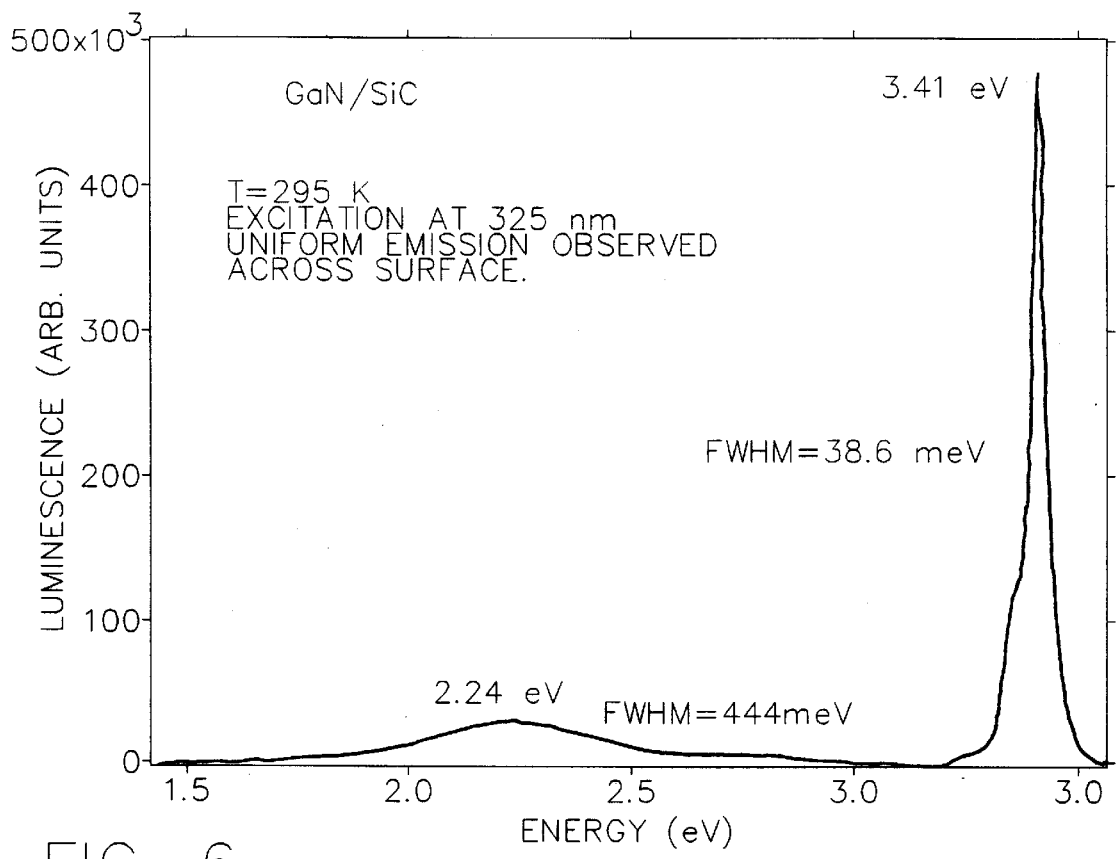
FIG. 6 is a plot of photoluminescence (luminescence versus energy in eV) for semiconductor LEDs according to the present invention.

FIG. 6 is a plot of photoluminescence versus energy for gallium nitride on silicon carbide and demonstrating a sharp emission peak maximized at 3.41 eV, with a full width at half maximum of only 38.6 meV.

Figure 7:
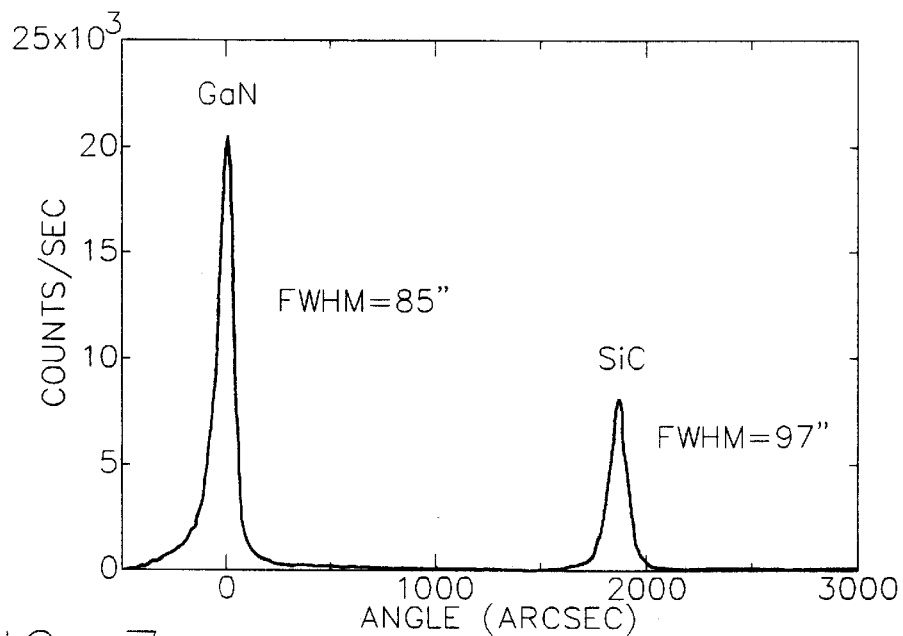
FIG. 7 is a double crystal x-ray rocking curve (DCXRC) for GaN on SiC according to the present invention.

FIG. 7 is a double-crystal x-ray rocking curve (DCXRC) for gallium nitride on silicon carbide and showing a full width at half maximum of only 85 arc seconds. As is known to those familiar with the evaluation of crystals and the DCXRC technique, the relatively small value for the full width at half maximum demonstrates excellent crystal properties.

Figure 8:
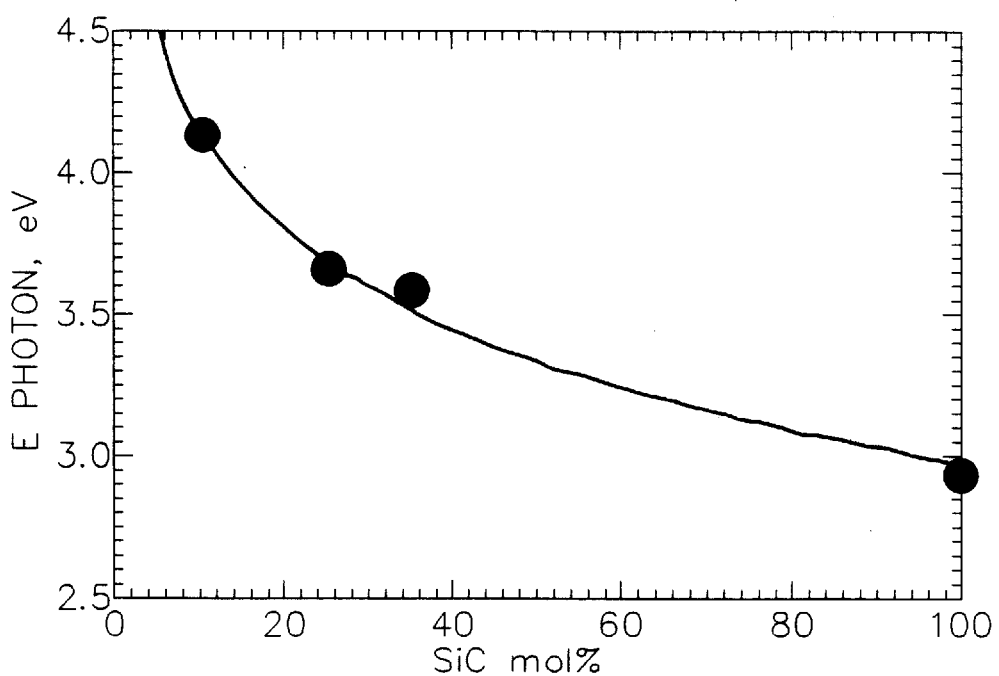
FIG. 8 is a plot of the cathodoluminescence (CL) edge peak energy as a function of SiC concentration in a SiC—AlGaN alloy according to the present invention.

Finally, FIG. 8 is a plot of the CL edge peak energy as a function of the mole percentage of silicon carbide (the SiC concentration) in $(SiC)_x(Al_yGa_{1-y}N)_{1-x}$ alloys according to the present invention. The CL measurements performed on this layer at 80K showed several peaks in the ultraviolet and violet regions. The dominant UV peak belonged to the GaN layer, but additional UV peaks with photon energies higher than the GaN peak were also observed. The photon energy for the dominant peak depends on the SiC concentration in the alloy layer as demonstrated by FIG. 8. For a layer with a SiC concentration of approximately 20 mole percent, the peak was detected at a wavelength of about 300 nanometers.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A substrate structure that will support a Group III nitride laser structure with minimum strain, the substrate structure comprising:

a silicon carbide substrate;

a first buffer layer upon said substrate formed of a graded composition of silicon carbide and aluminum gallium—nitride in which the portion adjacent the substrate is substantially entirely silicon carbide and the portion furthest from the substrate is substantially entirely aluminum gallium nitride with the portions therebetween being progressively graded in content from predominantly silicon carbide to predominantly aluminum gallium nitride; and a second buffer layer upon said first layer and progressively graded from a composition matching the composition of said first buffer layer to a composition matching the composition of the lower cladding layer of a laser structure built upon said substrate structure.

2. A substrate structure according to claim 1 and further comprising a laser structure on said second buffer layer, and wherein said laser structure includes an active, layer selected from the group Consisting of: gallium nitride; aluminum nitride; indium nitride; ternary Group III nitrides having the formula $A_xB_{1-x}N$; where A and B are Group III elements and where x is zero, one, or a fraction between zero and one; and quaternary Group III nitrides having the formula $Al_xGa_yIn_{1-x-y}N$, and where x and y are 0, 1, or a fraction between 0 and 1 and where 1 is greater than (x+y); and alloys of silicon carbide with such ternary Group III nitrides.

3. A substrate structure according to claim 2 wherein said active layer further comprises:

respective upper and lower waveguide layers adjacent both surfaces of said active layer;

an upper cladding layer on said upper waveguide layer; and a lower cladding layer below said lower waveguide layer.

4. A substrate structure according to claim 3 and further comprising a strain-minimizing contact layer above said laser structure, and wherein said strain-minimizing layer has a lattice constant substantially the same as said second buffer layer.

* * * * *